US010868186B2

(12) United States Patent
Chiang et al.

(10) Patent No.: US 10,868,186 B2
(45) Date of Patent: Dec. 15, 2020

(54) FINFETS WITH SOURCE/DRAIN CLADDING

(71) Applicant: Taiwan Semiconductor Manufacturing Co., Ltd., Hsinchu (TW)

(72) Inventors: Kuo-Cheng Chiang, Zhubei (TW); Ka-Hing Fung, Zhudong Township (TW); Zhiqiang Wu, Chubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/909,079

(22) Filed: Jun. 23, 2020

(65) Prior Publication Data

US 2020/0321461 A1 Oct. 8, 2020

Related U.S. Application Data

(63) Continuation of application No. 16/376,563, filed on Apr. 5, 2019, now Pat. No. 10,707,349, which is a (Continued)

(51) Int. Cl.
*H01L 29/78* (2006.01)
*H01L 29/06* (2006.01)
(Continued)

(52) U.S. Cl.
CPC ........ *H01L 29/785* (2013.01); *H01L 29/0653* (2013.01); *H01L 29/165* (2013.01); *H01L 29/66795* (2013.01); *H01L 29/7848* (2013.01)

(58) Field of Classification Search
None
See application file for complete search history.

(56) References Cited

U.S. PATENT DOCUMENTS 6,800,910 B2 10/2004 Lin et al.
6,882,025 B2 4/2005 Yeo et al.
(Continued)

FOREIGN PATENT DOCUMENTS

CN 103928518 A 7/2014
DE 102013103057 10/2013
(Continued)

OTHER PUBLICATIONS

Gas, P. et al., "Diffusion of Sb, Ga, Ge, and (As) in TiSi2," Journal of Applied Physics, vol. 63, Issue 11, Jun. 1, 1988, 1988 American Institute of Physics, pp. 5335-5345.
(Continued)

*Primary Examiner* — Evren Seven
(74) *Attorney, Agent, or Firm* — Slater Matsil, LLP

(57) ABSTRACT

A device includes a semiconductor substrate, and isolation regions extending into the semiconductor substrate. A semiconductor fin is between opposite portions of the isolation regions, wherein the semiconductor fin is over top surfaces of the isolation regions. A gate stack overlaps the semiconductor fin. A source/drain region is on a side of the gate stack and connected to the semiconductor fin. The source/drain region includes an inner portion thinner than the semiconductor fin, and an outer portion outside the inner portion. The semiconductor fin and the inner portion of the source/drain region have a same composition of group IV semiconductors.

20 Claims, 16 Drawing Sheets

10
124
122
132
132
120
20

Related U.S. Application Data continuation of application No. 15/699,226, filed on Sep. 8, 2017, now Pat. No. 10,269,964, which is a continuation of application No. 14/527,660, filed on Oct. 29, 2014, now Pat. No. 9,941,406.

(51) Int. Cl.
*H01L 29/66* (2006.01)
*H01L 29/165* (2006.01)

(56) References Cited

U.S. PATENT DOCUMENTS

| | | | |
|---|---|---|---|
| 7,485,520 B2 | 2/2009 | Zhu et al. | |
| 2005/0104096 A1* | 5/2005 | Lee | H01L 29/66795 257/288 |
| 2005/0112851 A1* | 5/2005 | Lee | H01L 29/775 438/497 |
| 2005/0184316 A1* | 8/2005 | Kim | H01L 29/785 257/213 |
| 2009/0008705 A1 | 1/2009 | Zhu et al. | |
| 2009/0026505 A1 | 1/2009 | Okano | |
| 2010/0099241 A1 | 4/2010 | Murano et al. | |
| 2010/0144121 A1 | 6/2010 | Chang et al. | |
| 2010/0163971 A1 | 7/2010 | Hung et al. | |
| 2011/0073952 A1 | 3/2011 | Kwok et al. | |
| 2012/0171832 A1 | 7/2012 | Toh et al. | |
| 2012/0292672 A1 | 11/2012 | Cho | |
| 2012/0292715 A1 | 11/2012 | Hong et al. | |
| 2013/0037863 A1 | 2/2013 | Wu et al. | |
| 2013/0230953 A1 | 9/2013 | Sudo | |
| 2013/0244387 A1 | 9/2013 | Cho | |
| 2013/0270652 A1 | 10/2013 | Liaw | |
| 2013/0313643 A1 | 11/2013 | Doris et al. | |
| 2013/0341638 A1 | 12/2013 | Liao et al. | |
| 2014/0001520 A1 | 1/2014 | Glass et al. | |
| 2014/0001562 A1 | 1/2014 | Liaw | |
| 2014/0012264 A1 | 1/2014 | Prybyla et al. | |
| 2014/0097487 A1 | 4/2014 | Yen et al. | |
| 2014/0175561 A1 | 6/2014 | Colinge et al. | |
| 2014/0197456 A1 | 7/2014 | Wang et al. | |
| 2014/0197457 A1 | 7/2014 | Wang et al. | |
| 2014/0197458 A1 | 7/2014 | Ching et al. | |
| 2014/0203334 A1 | 7/2014 | Colinge et al. | |
| 2014/0295634 A1 | 10/2014 | Liao et al. | |
| 2015/0008483 A1 | 1/2015 | Ching et al. | |
| 2015/0144998 A1 | 5/2015 | Ching et al. | |
| 2015/0162248 A1 | 6/2015 | Loubet et al. | |
| 2015/0206890 A1 | 7/2015 | Liaw | |
| 2015/0249153 A1 | 9/2015 | Morin et al. | |
| 2015/0303198 A1 | 10/2015 | Ching et al. | |
| 2015/0364594 A1 | 12/2015 | Mieno | |
| 2015/0380556 A1 | 12/2015 | Ching et al. | |
| 2016/0043225 A1 | 2/2016 | Ching et al. | |
| 2016/0064288 A1 | 3/2016 | Cheng et al. | |
| 2016/0099352 A1 | 4/2016 | Lee et al. | |
| 2016/0190319 A1 | 6/2016 | Kavalieros et al. | |
| 2019/0207028 A1 | 7/2019 | Cheng et al. | |

FOREIGN PATENT DOCUMENTS

| | | |
|---|---|---|
| DE | 102013105074 | 1/2014 |
| KR | 20050011455 A | 1/2005 |

OTHER PUBLICATIONS

LeGoues, F. K. et al., "Kinetics and mechanism of oxidation of SiGe: dry versus wet oxidation," Applied Physics Letters, vol. 54, Issue 7, Feb. 13, 1989, 1989 American Institute of Physics, pp. 644-646.

Tanaka, Masanori et al., "Abnormal oxidation characteristics of SiGe/Si-on-insulator structures depending on piled-up Ge fraction at SiO2/SiGe interface," Journal of Applied Physics, Issue 103, 2008, 2008 American Institute of Physics, 6 pages.

Tetelin, C. et al., "Kinetics and mechanism of low temperature atomic oxygen-assisted oxidation of SiGe layers," Journal of Applied Physics, vol. 83, Issue 5, Mar. 1, 1998, 1998 American Institute of Physics, pp. 2842-2846.

* cited by examiner 270
170
10
62
272
256/254
236
266
274
268
265
222
220
242-2
242-1
200
136/236
62 62
172
272
174
166
165
168
122
120
124-2
124-1
100
136
154/156

FINFETS WITH SOURCE/DRAIN CLADDING

PRIORITY CLAIM AND CROSS-REFERENCE

This application is a continuation application of U.S. patent application Ser. No. 16/376,563, filed Apr. 5, 2019, entitled "FinFETs with Source/Drain Cladding", which is a continuation application of U.S. patent application Ser. No. 15/699,226, filed Sep. 8, 2017, now U.S. Pat. No. 10,269,964, entitled "FinFETs with Source/Drain Cladding", which is a continuation application of U.S. patent application Ser. No. 14/527,660, filed Oct. 29, 2014, now U.S. Pat. No. 9,941,406, entitled "FinFETs with Source/Drain Cladding", each application is hereby incorporated herein in its entirety.

This application relates to the following commonly-assigned U.S. patent application Ser. No. 14/451,503, filed Aug. 5, 2014, and entitled "Nonplanar Device and Strain-Generating Channel Dielectric", which application is hereby incorporated herein by reference.

BACKGROUND

Technological advances in IC materials and design have produced generations of ICs where each generation has smaller and more complex circuits than previous generations. Functional density (i.e., the number of interconnected devices per chip area) has generally increased while geometry size (i.e., the smallest component (or line) that can be created using a fabrication process) has decreased. This scaling down process provides benefits by increasing production efficiency and lowering associated costs.

Such scaling down has also increased the complexity of processing and manufacturing ICs and, for these advances to continue to be realized, further advances in IC processing and manufacturing are also needed. For example, three-dimensional transistors such as a Fin Field-Effect Transistors (FinFETs) have been introduced to replace planar transistors. Although existing FinFET devices and methods of fabricating FinFET devices have been generally adequate for their intended purposes, they have not been entirely satisfactory in all respects. Improvements in this area are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4A, 5-10A, and 11-12A are perspective views.

DETAILED DESCRIPTION

Figure 1:
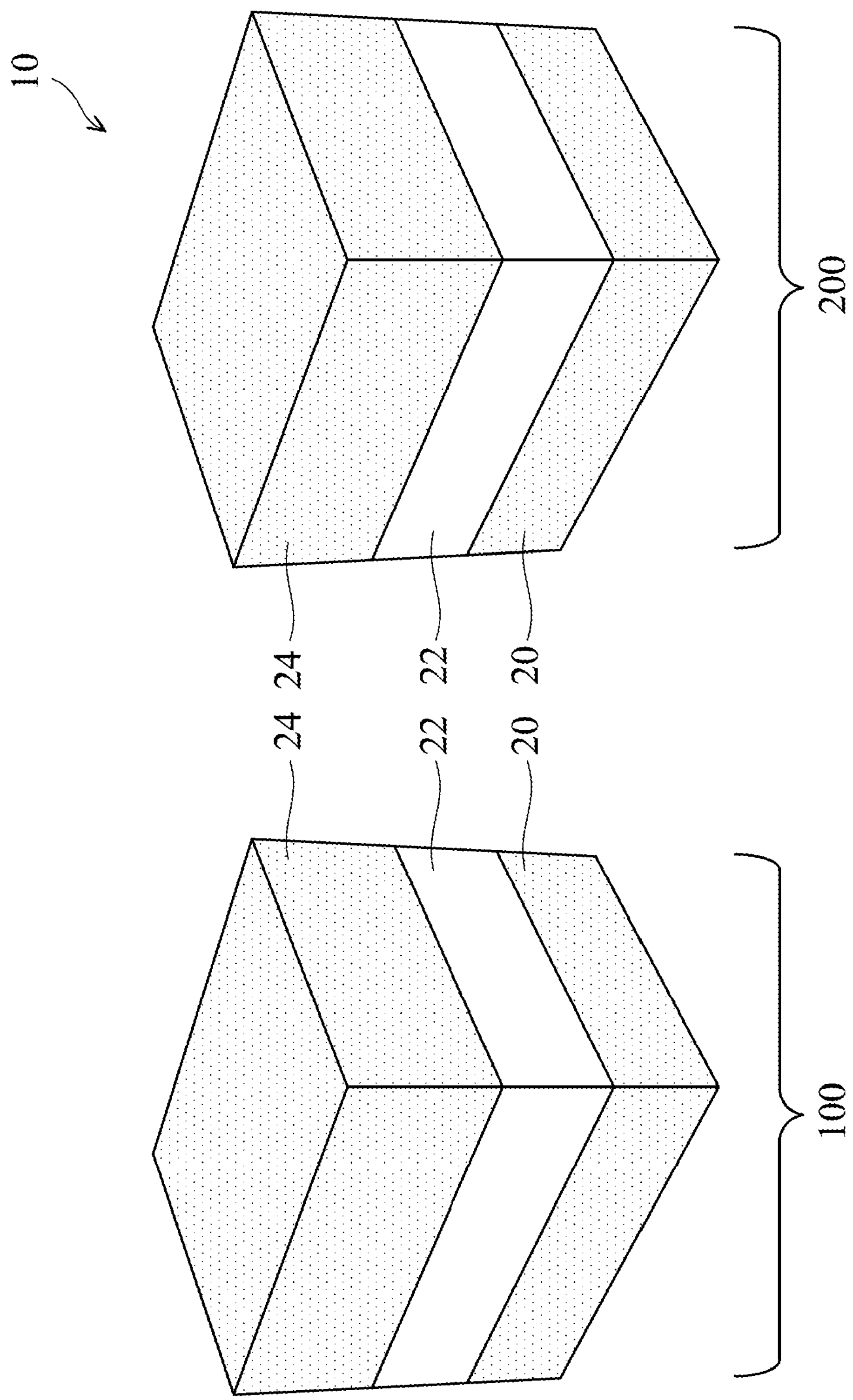

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments, features and aspects of the present disclosure will be discussed generally. In general, the present disclosure relates to, but is not limited to, Complementary Metal-Oxide-Semiconductor (CMOS) devices, which include a P-type Metal-Oxide-Semiconductor (PMOS) FinFET device and an N-type Metal-Oxide-Semiconductor (NMOS) FinFET device. Methods of forming same are provided in accordance with various exemplary embodiments. Intermediate stages of forming exemplary FinFETs are illustrated and discussed, including variations of the embodiments. Throughout the various views and illustrative embodiments, like reference numbers are used to designate like elements.

FIG. 1 illustrates wafer 10 including substrate 20, and semiconductor layers 22 and 24 over substrate 20. In accordance with some embodiments, substrate 20 comprises crystalline silicon, and may be free from germanium. In some embodiments wafer 20 is a bulk, single crystal semiconductor wafer. In other embodiments, wafer 20 comprises a silicon-on-insulator (SOI) wafer, as is known in the art. Semiconductor layer 22 comprises silicon germanium (SiGe). In accordance with some embodiments of the present disclosure, the germanium percentage in semiconductor layers 22 is in a range of between about 30 percent and about 80 percent. The thickness of semiconductor layer 22 may be in a range of between about 20 nm and about 90 nm. Semiconductor layer 24 may be a silicon layer free from germanium in accordance with some embodiments. In alternative embodiments, semiconductor layer 24 may comprise silicon phosphorus (SiP).

Wafer 10 includes illustrative regions 100 and 200. Region 100 is an n-type FinFET region, in which an n-type FinFET is to be formed. Region 200 is a p-type FinFET region, in which a p-type FinFET is to be formed. Although the figures throughout the present disclosure illustrate regions 100 and 200 as being separate from each other, regions 100 and 200 are portions of the same wafer 10, and may be in the same chip. For example, substrate 20 shown in regions 100 and 200 are portions of a same continuous substrate, and semiconductor layers 22 and 24 are also portions of the same continuous layers.

Figure 2:
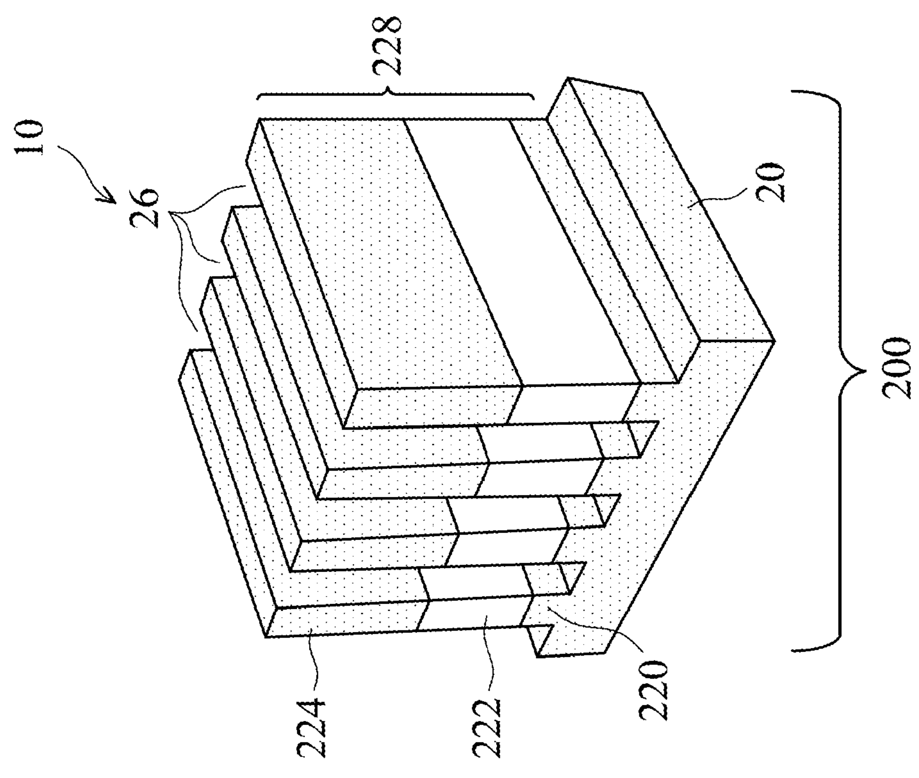
Figure 2:
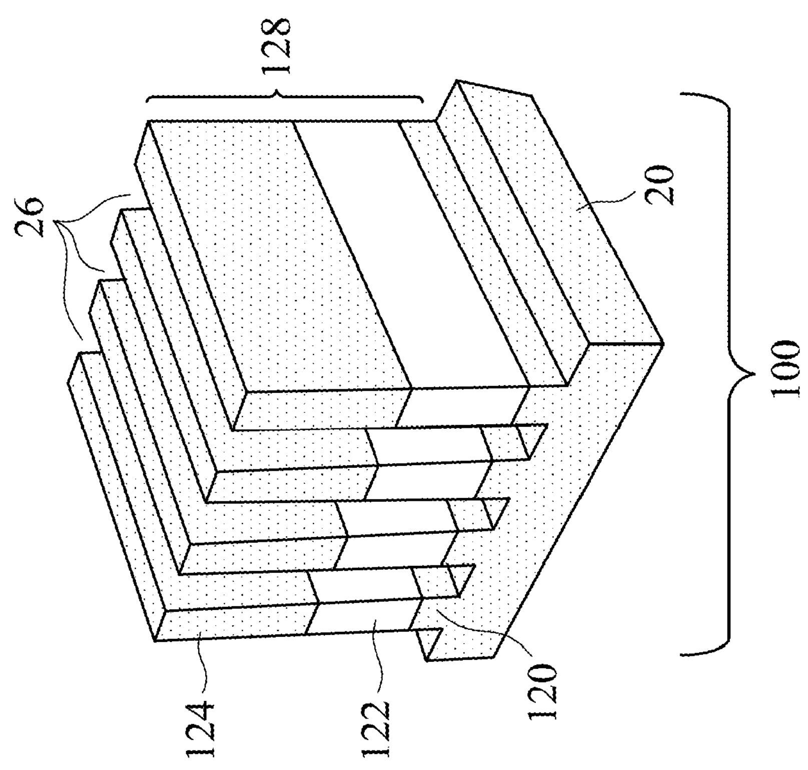

Referring to FIG. 2, layers 22 and 24 are subjected to a patterning process to form a plurality of trenches 26, which extend into wafer 10. Trenches 26 define some un-patterned portion of semiconductor substrate 20 and semiconductor layers 22 and 24 as a plurality of semiconductor strips 128 and 228, which are in regions 100 and 200, respectively.

Semiconductor strips 128 include portions 120 of the patterned substrate 20, portions 122 of the patterned semiconductor layer 22, and portions 124 of the patterned semiconductor layer 24. Semiconductor strips 228 include portions 220 of the patterned substrate 20, portions 222 of the patterned semiconductor layer 22, and portions 224 of the patterned semiconductor layer 24. In accordance with some embodiments, semiconductor strips 128 and 228 have respective widths of between about 4 nm and about 10 nm. Throughout the description, strips 120, 220, 124, and 224 are referred to as silicon strips, and strips 122 and 222 are referred to as SiGe strips.

Figure 3:
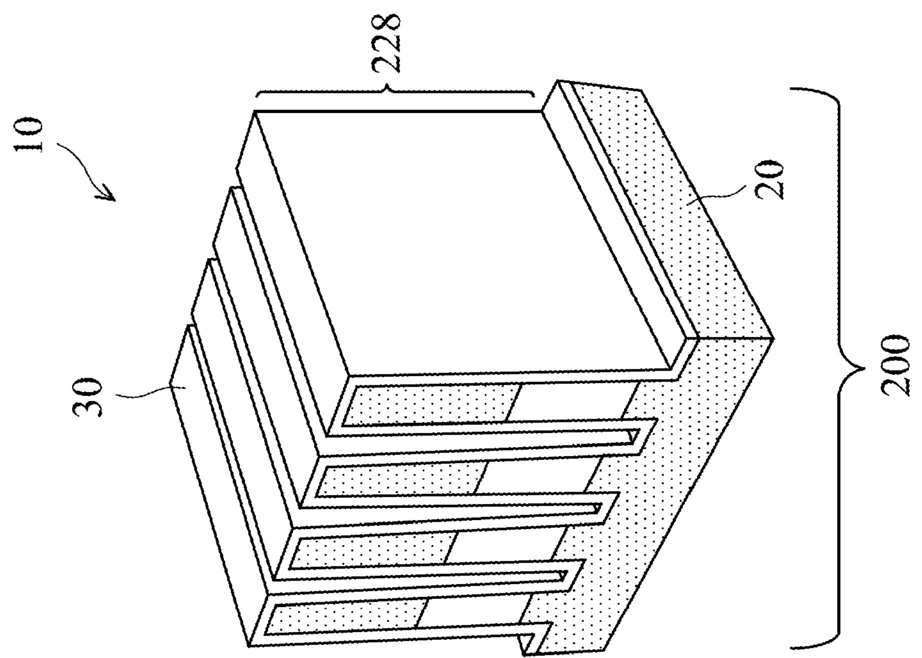
Figure 3:
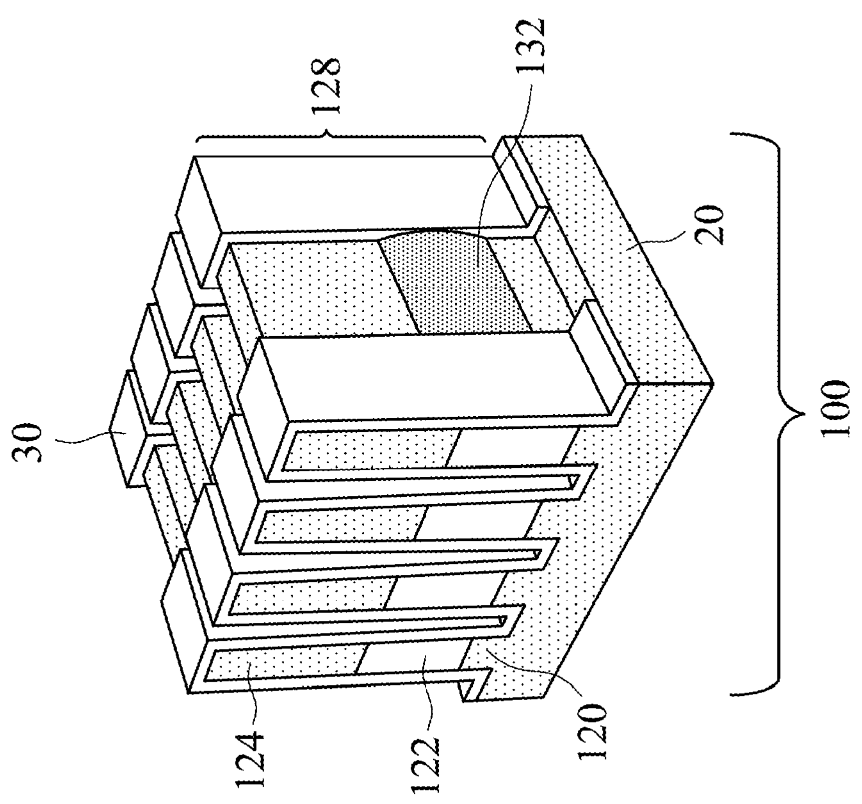

FIG. 3 illustrates the formation of hard mask 30 and a subsequent oxidation process. As shown in FIG. 3, hard mask 30 is formed on top surfaces and sidewalls of semiconductor strips 128 and 228, and covers exposed top surfaces of semiconductor substrate 20 (i.e. the respective bottoms of trenches 26). Furthermore, hard mask 30 is formed in both n-type FinFET region 100 and p-type FinFET region 200. Next, a patterning process is performed to remove a portion of hard mask 30 from the middle portions of semiconductor strips 128. The portions of hard mask 30 on the opposite end portions of semiconductor strips 128 are left intact. In addition, the portion of hard mask 30 in p-type FinFET region 200 is not patterned. As shown in FIG. 3, entire fin 228 is covered in region, but a middle portion of fin 128 in region 100 is not covered.

Hard mask 30 is formed as a conformal layer with horizontal portions and vertical portions having thicknesses relatively close to each other. In accordance with some embodiments, hard mask 30 comprises silicon nitride, silicon carbide, silicon oxynitride, titanium nitride, tantalum nitride, or other materials that have high etching selectivity relative to semiconductor strips 128 and 228 as well as relative to silicon oxide.

Next, an oxidation is performed, so that the middle portions of SiGe strips 122 (FIG. 2) that are not covered by hard mask 30 are oxidized to form silicon germanium oxide ($SiGeO_x$) regions 132. SiGe strips 222 and more particularly the end portions of SiGe strips 122 are protected by hard mask 30, and hence are not oxidized. After the oxidation, hard mask 30 is removed, and the resulting structure is shown in FIG. 4A, which illustrates that $SiGeO_x$ regions 132 are in the middle of semiconductor strips 128.

Figure 4A:
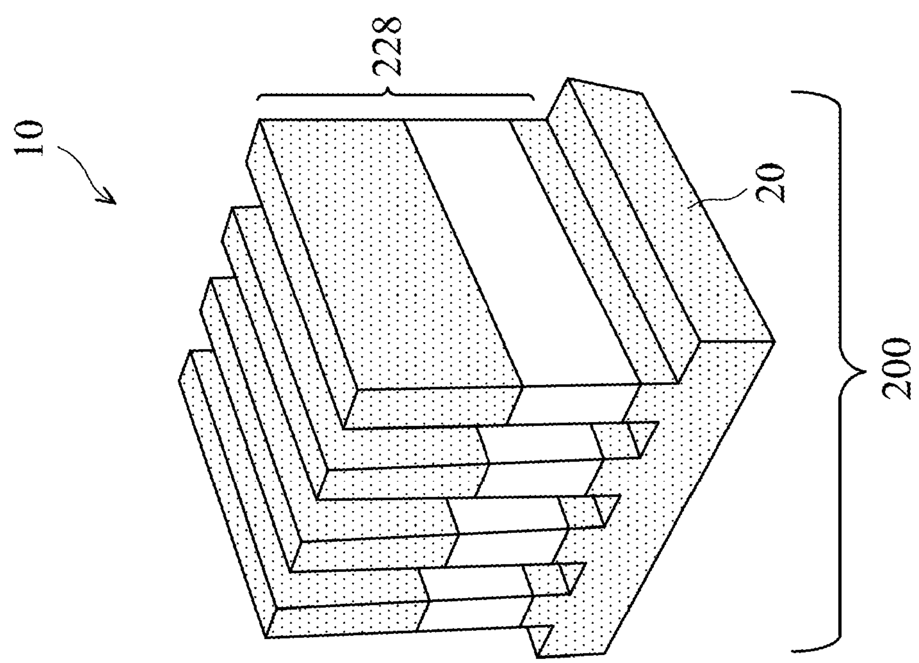
Figure 4A:
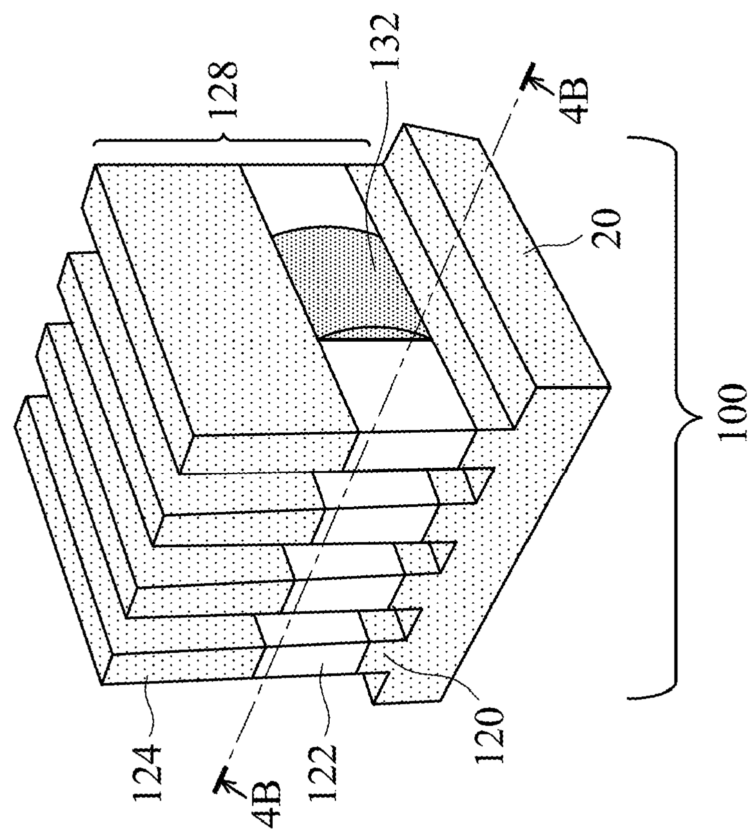
Figure 4B:
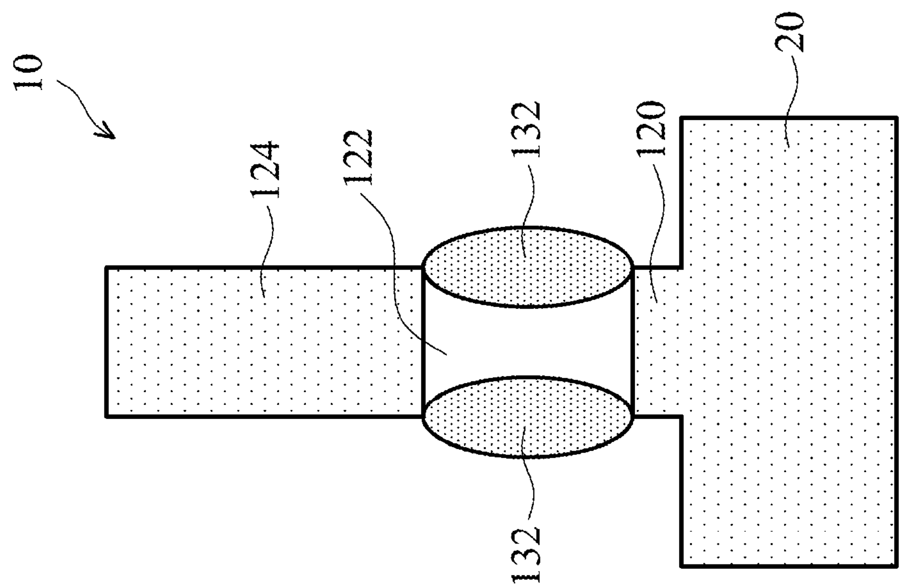
FIGS. 4B, 10B, and 12B-12C are of cross-sectional view, of intermediate stages in the manufacturing of exemplary Fin Field-Effect Transistors (FinFETs).

FIG. 4B illustrates a cross-sectional view of one of strips 128, wherein the cross-sectional view is obtained from a vertical plane containing line 4B-4B in FIG. 4A. For clarity, a single semiconductor strip 128 is illustrated. As shown in FIG. 4B, an inner portion of SiGe strip 122 remains unoxidized. The middle portions of silicon strips 120 and 124 not covered by hard mask 30 (FIG. 3) may also be partially oxidized. However, the oxidation rate of the middle portions of SiGe strips 122 is much higher (sometimes 30 times higher) than the oxidation of silicon strips 120 and 124. The resulting oxide (not shown) on the surface of silicon strips 120 and 124 is hence very thin (which may have thicknesses smaller than about 5 Å), and hence is not shown herein. The oxidation may be performed through by furnace oxidation, e.g., by exposing wafer 10 to an oxygen environment, with an oxidation temperature of between about 400° C. and about 600° C., for example. The duration of the oxidation process may be in the range of between about 20 minutes and about 40 minutes. The oxidation process duration depends on the temperature. Lower temperatures require longer oxidation durations, and vice versa. Alternatively, oxidation may be performed using a chemical oxidation method at a low temperature (for example, between about 20° C. and 80° C.), using for example, a hydrogen peroxide ($H_2O_2$) solution as an oxidant. The resulting $SiGeO_x$ regions 132 may include two portions formed on the opposite sides of the remaining SiGe strip 122. In accordance with some embodiments, $SiGeO_x$ regions 132 have respective thicknesses of between about 3 nm and about 10 nm.

While intending to be bound by any particular underlying theory, it is believed that during the oxidation process, germanium atoms in SiGe strips 122 tend to migrate inwardly from $SiGeO_x$ regions 132 and toward the center (the inner portion) of the respective SiGe strips 122, causing germanium condensation in the inner portion of SiGe strips 122. As a result, the remaining portions (i.e. non-oxidized portions) of SiGe strips 122 have a germanium concentration higher than the corresponding germanium concentration in SiGe strips 222 (FIG. 4A).

Due to the oxidation process, the volume of $SiGeO_x$ regions 132 expands to be greater than the volume of the portions of SiGe strips 122 from which the $SiGeO_x$ regions 132 are generated. Accordingly, the swelling of the material results in a lateral tensile strain to be generated to push the source/drain regions 154 (FIG. 12A) apart from each other. A vertical strain is also generated to push up silicon strips 124, wherein silicon strips 124 will be used to form the channels of the resulting n-type FinFET. Accordingly, the oxidation of SiGe strips 122 advantageously results in the generation of desirable strains in the resulting n-type FinFET. By contrast, SiGe strips 222 in region 200 are masked to prevent undesirable strain in resulting p-type FinFETs formed therein.

Figure 5:
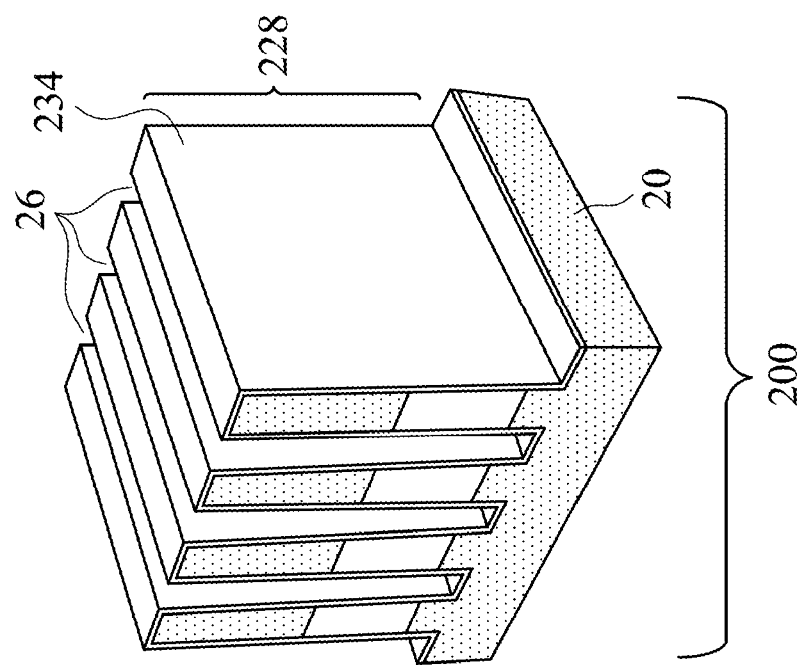
Figure 5:
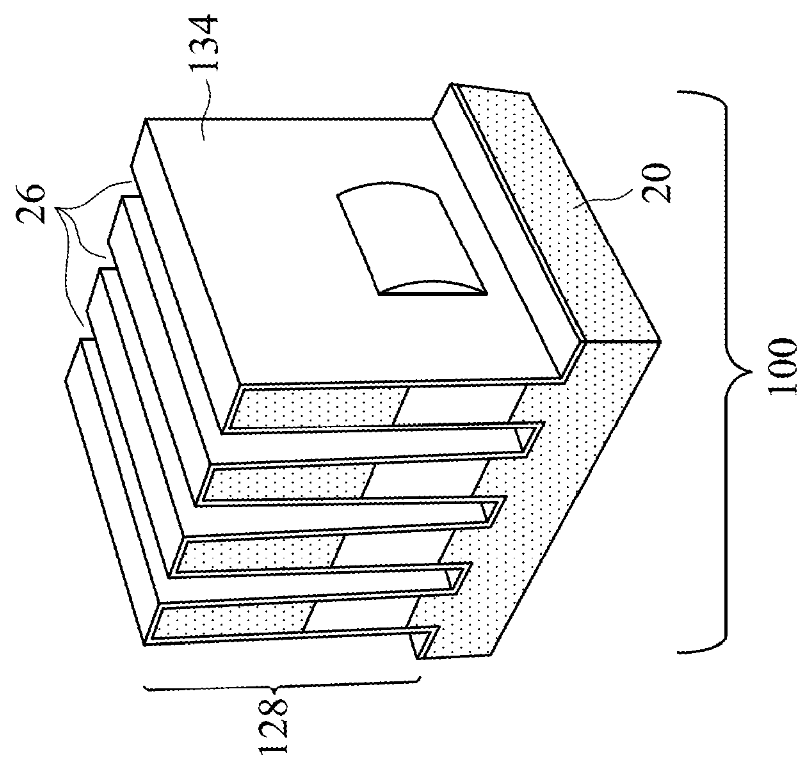

Referring to FIG. 5, dielectric liners 134 and 234 are formed on the top surfaces and the sidewalls of semiconductor strips 128 and 228, respectively. Furthermore, dielectric liners 134 and 234 extend onto and are in contact with the sidewalls of $SiGeO_x$ regions 132 (FIG. 4A). In accordance with some embodiments of the present disclosure, dielectric liners 134 and 234 are formed of silicon nitride, aluminum oxide ($Al_2O_3$), silicon oxynitride, silicon carbide, combinations thereof, or multi-layers thereof. Dielectric liners 134 and 234 may be formed simultaneously in regions 100 and 200, e.g., using the same processes and materials, in some embodiments. Dielectric liners 134 and 234 are formed as conformal layers, with vertical portions and horizontal portions having thicknesses equal to or substantially close to (for example, with a difference less than about 20 percent) from each other. The thickness of dielectric liners 134 and 234 may be in the range of between about 2 nm and about 6 nm.

Figure 6:
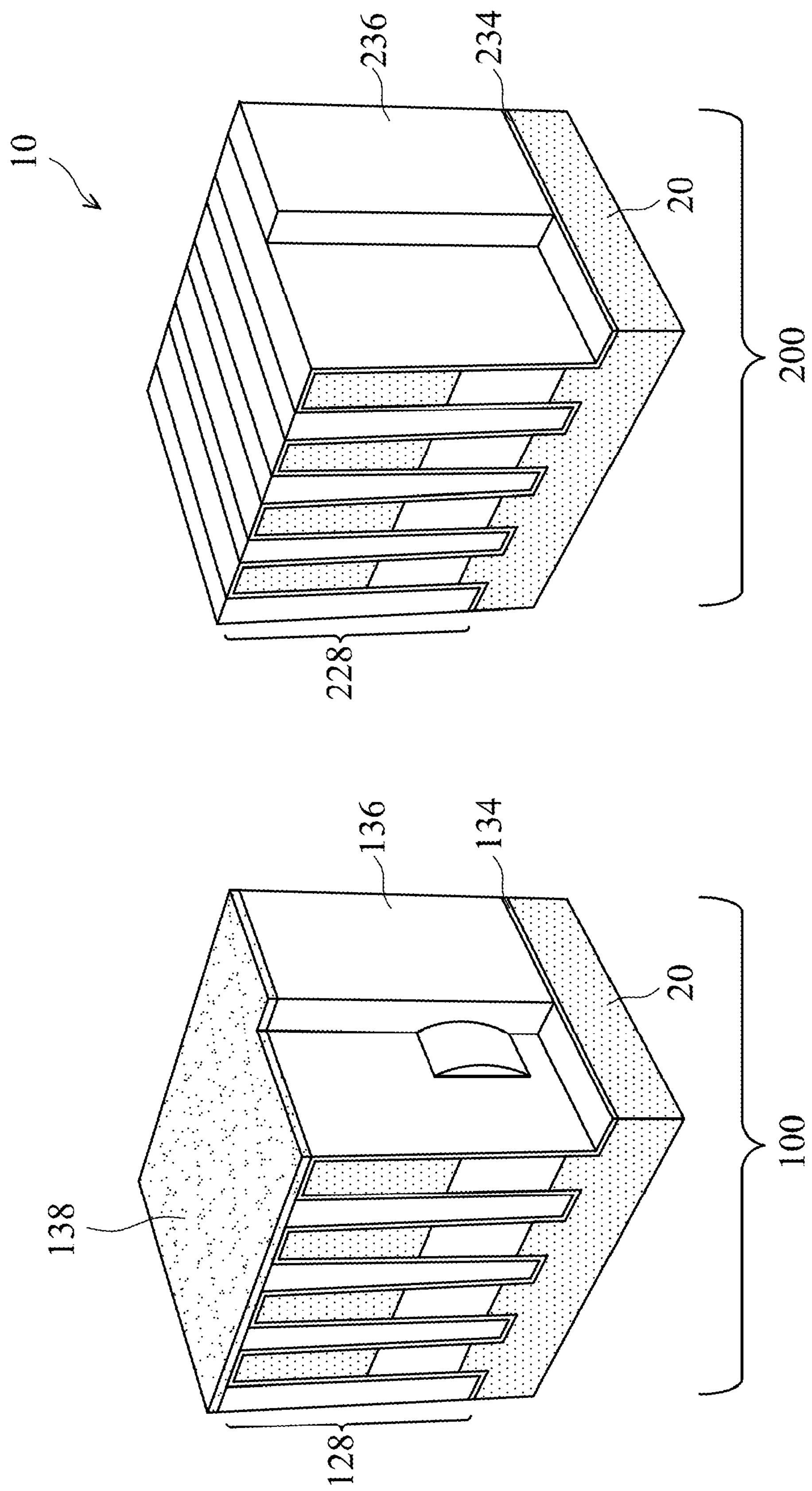

Next, isolation regions are formed in trenches 26 in regions 100 and 200. The resulting isolation regions 136 and 236 are shown in FIG. 6, and are also referred to as Shallow Trench Isolation (STI) regions 136 and 236 throughout the description. In the formation of STI regions 136 and 236, trenches 26 (FIG. 5) are filled with a dielectric material first. The dielectric material may be formed, for example, using a method selected from spin-on coating, Flowable Chemical Vapor Deposition (FCVD), and the like. The dielectric material may include highly-flowable materials, as are known in the art. In accordance with alternative embodiments, the dielectric material is deposited using a deposition method such as High-Density Plasma Chemical Vapor Deposition (HDPCVD) and High-Aspect Ratio Process (HARP).

An anneal step may then be performed on wafer 10, by which dielectric material is solidified, in some embodiments. The anneal may include, for example, steam anneal using In-Situ Steam Generation (ISSG), with a combined gas of hydrogen ($H_2$) and oxygen ($O_2$) used to generate the steam.

After the formation of the dielectric material, a Chemical Mechanical Polish (CMP) is performed to remove excess portions of the dielectric material over the top surface portions of dielectric liners 134 and 234, and hence STI regions 136 and 236 are formed. In accordance with some embodiments of the present disclosure, the top surface portions of dielectric liners 134 and 234 are used as a CMP stop layer. The remaining portions of the dielectric material form STI regions 136 and 236. STI regions 136 and 236 may comprise silicon oxide, for example, although other dielectric materials may also be used. The top surfaces of STI regions 136 and 236 may be substantially level with each other, and level with the top surfaces of dielectric liners 134 and 234.

Further referring to FIG. 6, hard mask 138 is form and patterned. The structures in n-type FinFET region 100 are covered by hard mask 138, and the structures in p-type FinFET region 200 are left exposed in the illustrated embodiment. In FIG. 6 and the subsequent drawings, to illustrate otherwise hidden features, some portions of the front features such as STI regions 136 and 236 are omitted from the figures, so that the otherwise features may be illustrated. It will be appreciated that the omitted portions of these feature still exist. In accordance with some embodiments of the present disclosure, hard mask 138 is formed of silicon nitride, silicon oxide, or other suitable materials. Furthermore, hard mask 138 may be formed of a material different from the martial of dielectric liners 134 and 234 in some embodiments, so that dielectric liners 134 and 234 can be etched without etching hard mask 138, and vice versa.

Figure 7:
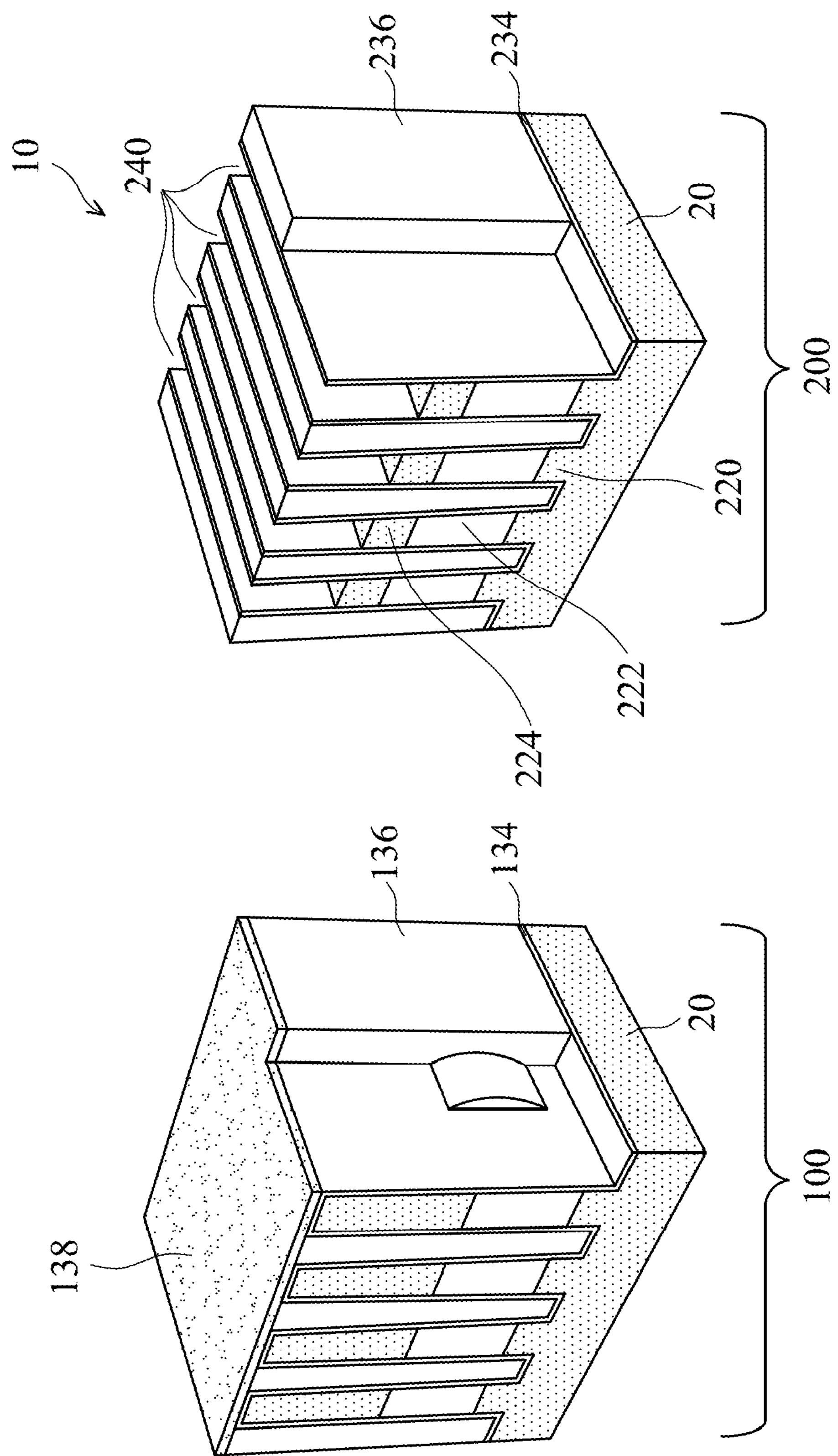

FIG. 7 illustrates the recessing of silicon strips 224, hence forming recesses 240 in region 200. The etching may be performed using a wet etch, such as potassium hydroxide (KOH) or Tetramethylammonium hydroxide (TMAH) as examples. In accordance with some embodiments of the present disclosure, the etching is stopped before SiGe strips 222 are exposed. Accordingly, after the etching, bottom portions of silicon strips 224 remain to cover SiGe strips 222. It is appreciated that although the remaining silicon strips 224 are illustrated as having flat top surfaces, the top surfaces may also form V-Shapes in alternative embodiments. In accordance with other embodiments, after the etching, silicon strips 224 are removed, and SiGe strips 222 are exposed. Hard mask 138 ensures that strips 128 are not etched during this process.

Figure 8:
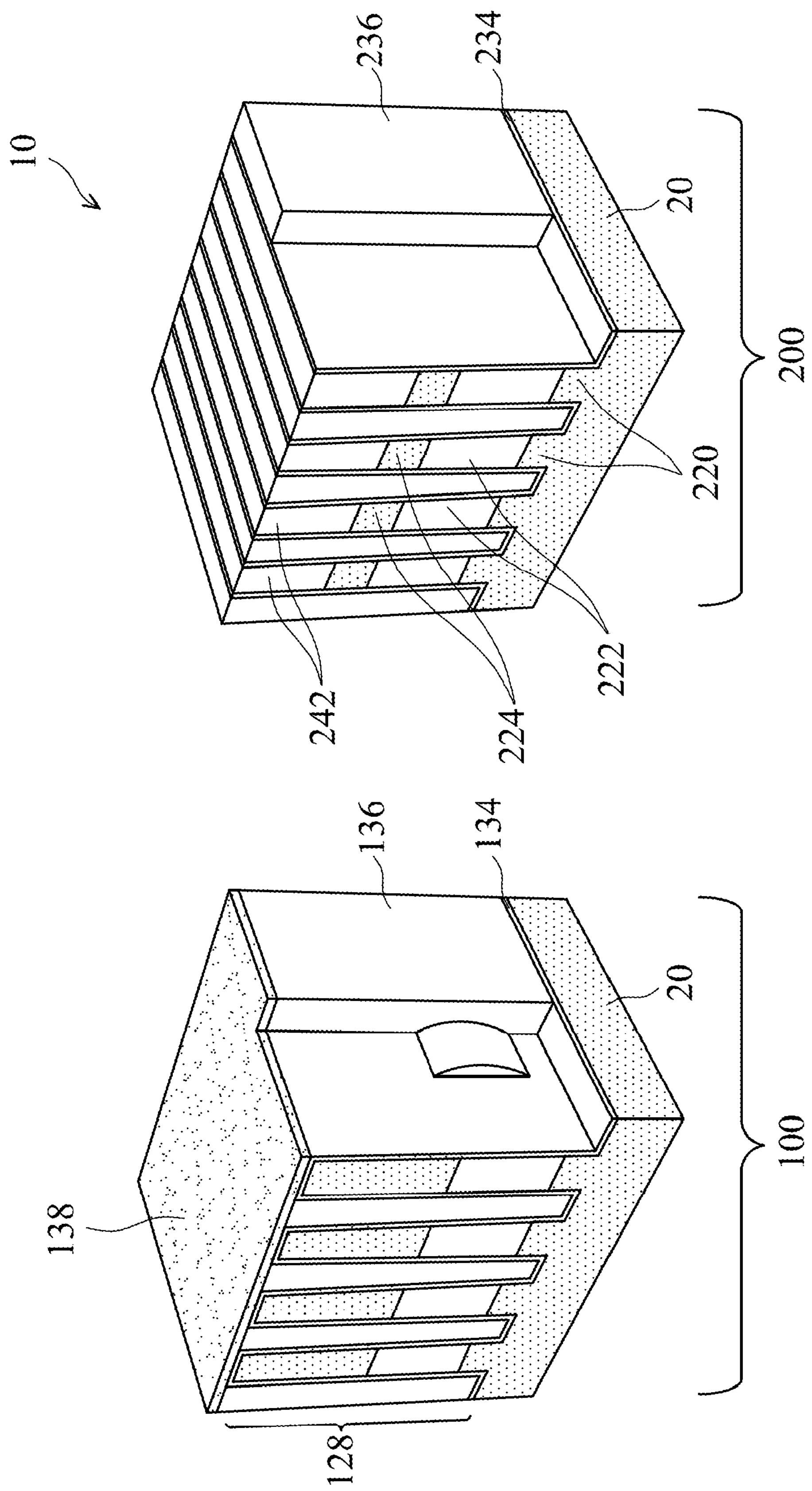

Next, as shown in FIG. 8, SiGe strips 242 are epitaxially grown in recesses 240 (FIG. 7). Accordingly, SiGe strips 242 are grown over and in contact with silicon strips 224 or SiGe strips 222, depending upon the embodiment. In accordance with some embodiments of the present disclosure, SiGe strips 242 have a first germanium (atomic) percentage in the range of between about 30 percent and about 50 percent. The SiGe may be epitaxially grown to be level with the top surfaces of STI regions 236, or may be grown to a level higher than the top surfaces of STI regions 236, and then a CMP process used to planarize the top surfaces of the SiGe with the top surfaces of STI regions 236. The remaining portions of the epitaxially grown SiGe material form SiGe strips 242.

Figure 9:
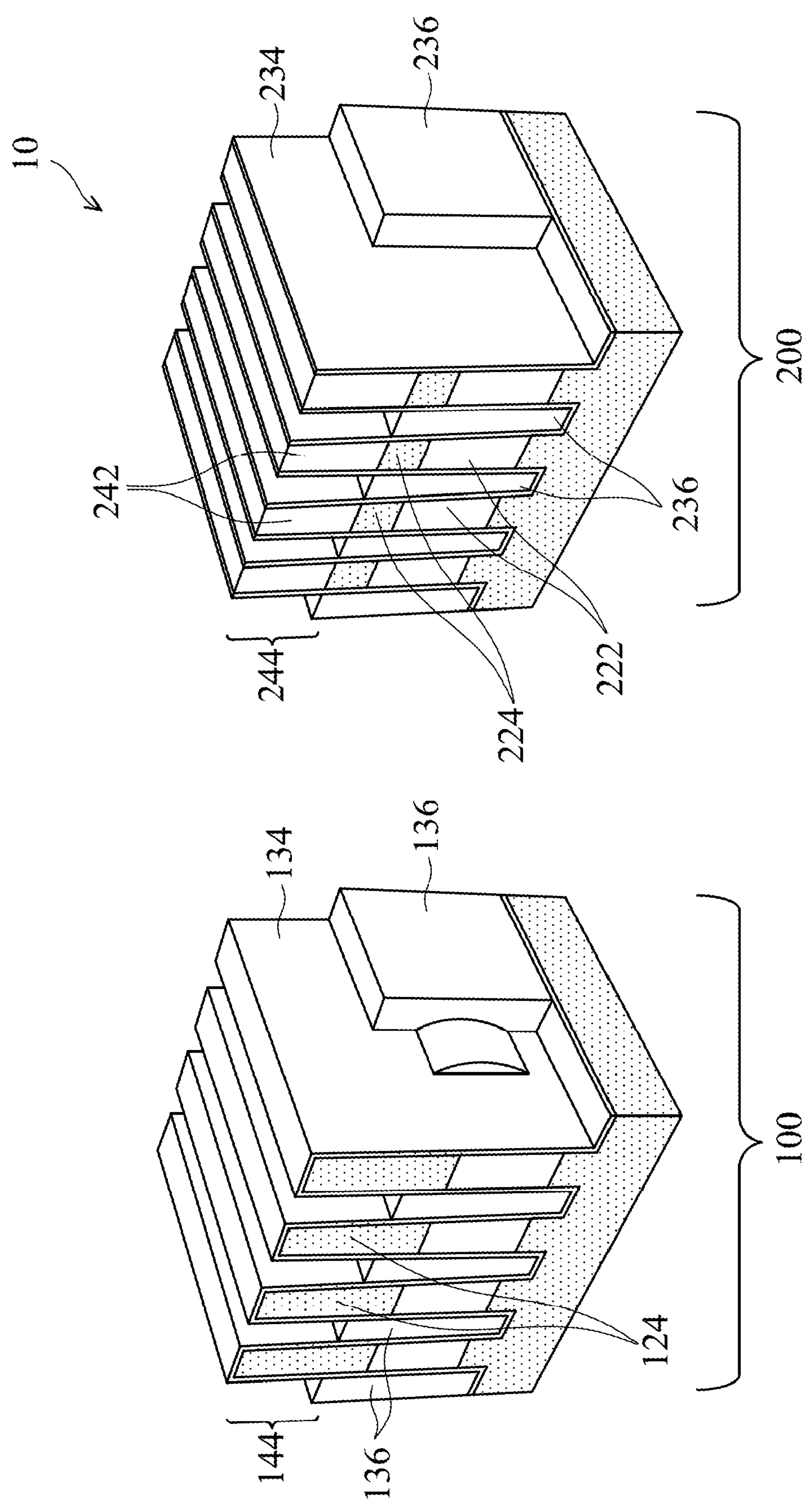

Next, hard mask 138 is removed, followed by the recessing of STI regions 136 and 236. The resulting structure is shown in FIG. 9. In region 100, silicon strips 124 have top portions higher than the top surfaces of the remaining STI regions 136, wherein the top portions of silicon strips 124 are referred to as semiconductor fins (silicon fins) 144 hereinafter. In accordance with some embodiments of the present disclosure, the top surfaces of the remaining STI regions 136 are level with or higher than the top ends of $SiGeO_x$ regions 132 (FIGS. 4A and 4B), which are covered by dielectric liner 134 in FIG. 9.

At the same time STI regions 136 are recessed, STI regions 236 are also recessed. SiGe strips 242 have top portions higher than the top surfaces of the remaining STI regions 236, wherein the top portions of SiGe strips 242 are referred to as semiconductor fins (SiGe fins) 244 hereinafter. In accordance with some embodiments, semiconductor fins 144 and 244 have heights between about 20 nm and about 40 nm. The top surfaces of the remaining STI regions 236 may be level with or higher than the top ends of the remaining silicon strips 224, if any, or level with or higher than the top surfaces of SiGe strips 222 if silicon strips 224 are fully removed in the preceding steps.

Figure 10A:
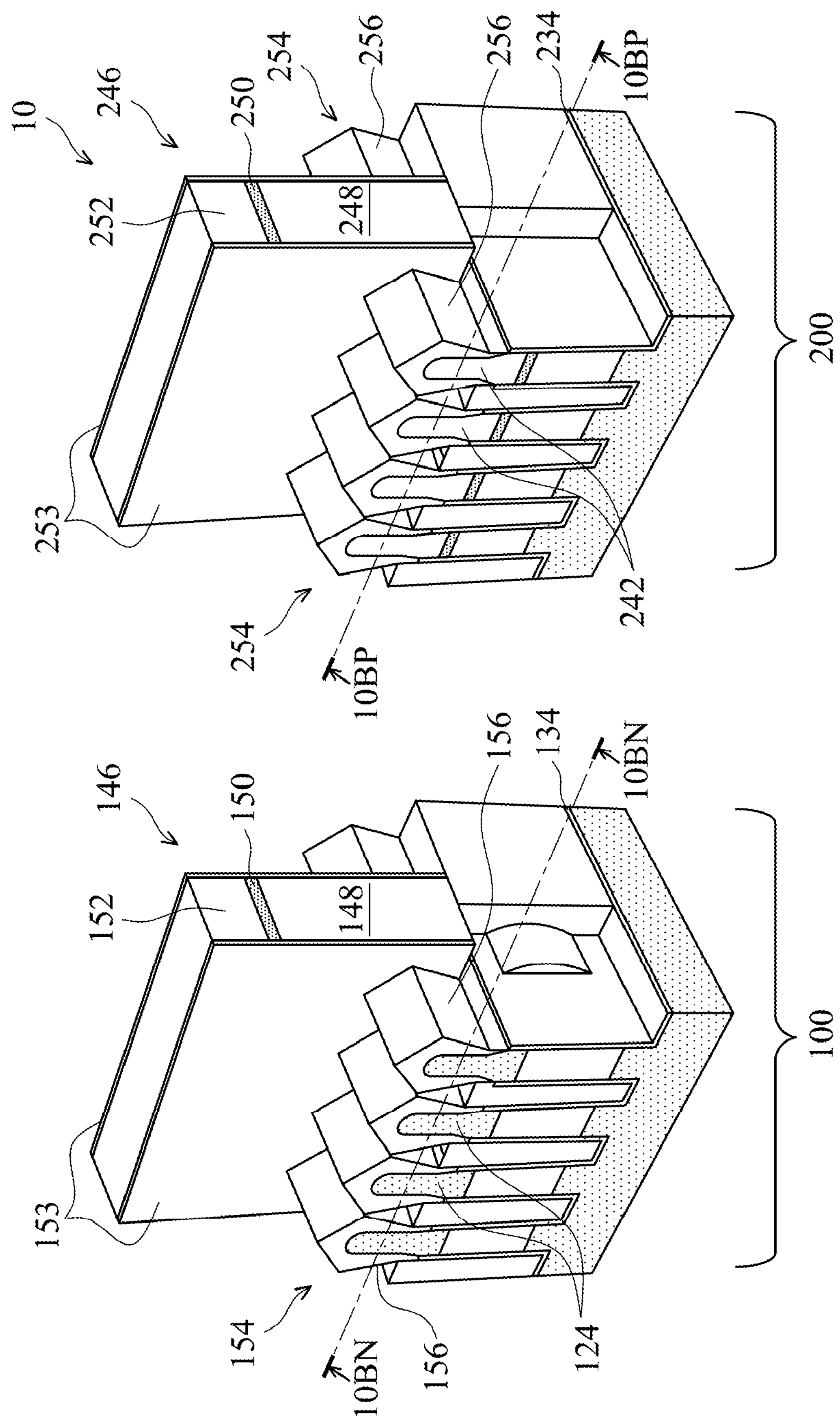

As shown in FIG. 9, some portions of dielectric liners 134 and 234 are exposed. These portions of dielectric liners 134 and 234 are then removed. Next, as shown in FIG. 10A, dummy gate stacks 146 and 246 are formed to cover the middle portions of semiconductor fins 144 and 244 (FIG. 9), respectively. The end portions of semiconductor fins 144 and 244 are not covered. In accordance with some embodiments, gate stack 146 includes dummy gate 148 and mask layers 150 and/or 152, and gate stack 246 includes dummy gate 248 and mask layers 250 and/or 252. Dummy gates 148 and 248 may be formed of polysilicon in accordance with some embodiments, although other materials may be used. In some exemplary embodiments, mask layers 150 and 250 are formed of silicon nitride, and mask layers 152 and 252 are formed of silicon oxide. Although not shown in FIG. 9, a dummy gate dielectric such as a silicon oxide layer may be formed underlying dummy gates 148 and 248. Dummy gates 148 and 248 are formed on the top surfaces and the sidewalls of semiconductor fins 144 and 244 (FIG. 9), respectively. In addition, gate stacks 146 and 246 may include gate spacers 153 and 253, respectively, which are formed on the sidewalls of dummy gates 148 and 248, respectively.

FIG. 10A also illustrates the formation of source and drain regions (referred to as source/drain regions hereinafter) 154 in region 100 and source/drain regions 254 in region 200. Source/drain regions 154 include silicon strips 124 as center portions, and epitaxial regions 156 outside of silicon strips 124. Source/drain regions 254 includes SiGe strips 242 as center portions, and epitaxial regions 256 outside of silicon strips 124. The formation of source/drain regions 154 and 254 are discussed referring to FIG. 10B.

Figure 10B:
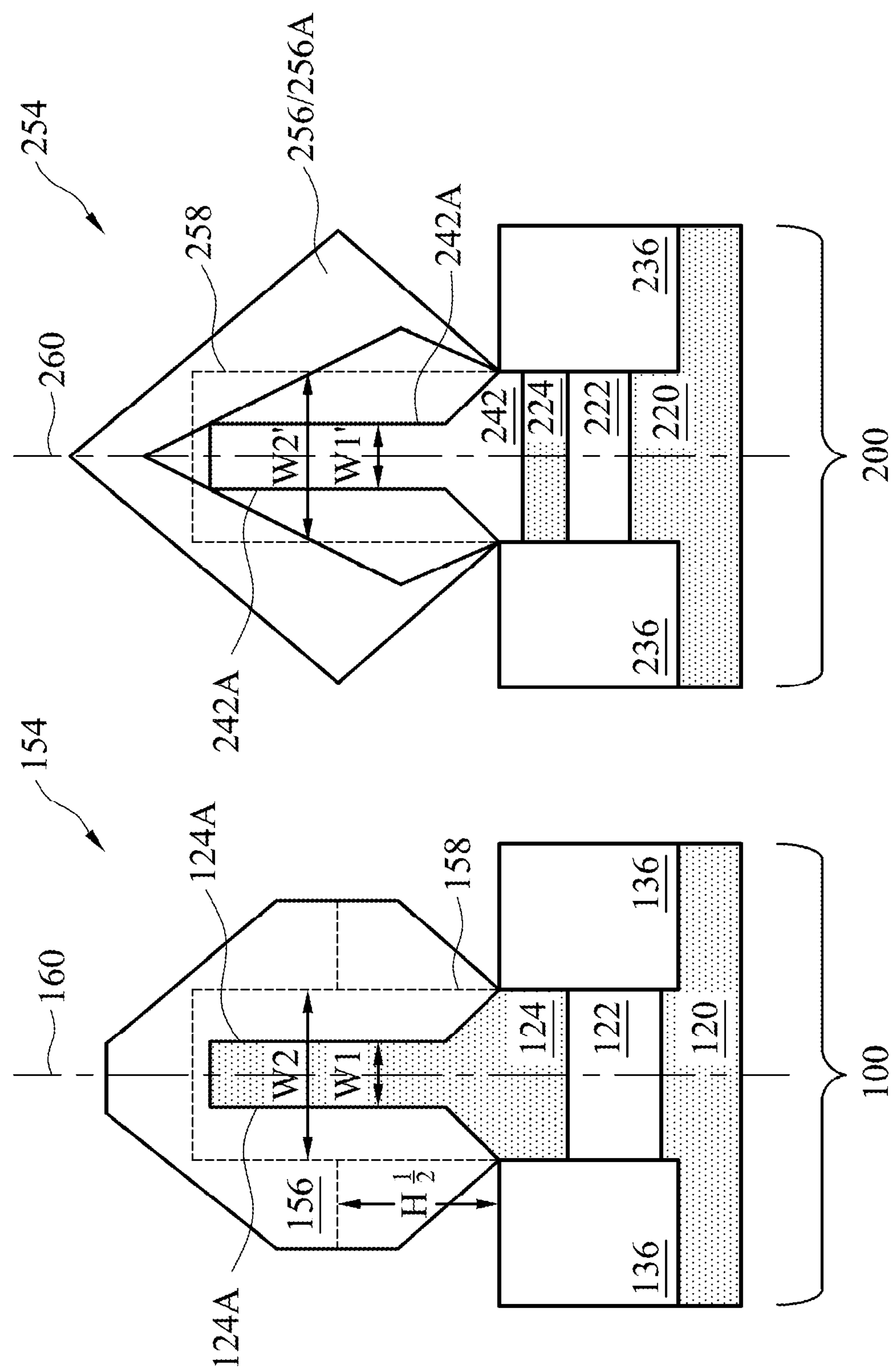

FIG. 10B includes the cross-sectional views of source/drain regions 154 and 254, wherein the cross-sectional view of source/drain region 154 is obtained from the vertical plane containing line 10BN-10BN in FIG. 10A, and the cross-sectional view of source/drain region 254 is obtained from the vertical plane containing lines 10BP-10BP in FIG. 10A.

In the formation of source/drain regions 154, semiconductor fin 144, which comprises silicon strip 124 in some embodiments, is thinned first. The thinning may include a wet etch, and the etchant may include a solution of HF, hydrogen peroxide ($H_2O_2$), and acetic acid ($CH_3COOH$), for example. Dashed lines 158 illustrate the positions of the edges and the top surface of silicon strip 124 before the thinning. As a result of the thinning, the width of the thinned silicon strip 124 (fin 144) is reduced from its original width W2 before the thinning to width W1 after the thinning. In accordance with some embodiments, width W1 is between about 50 percent and about 70 percent of width W2, although width W1 may be greater or smaller. Widths W1 and W2 may be measured from a middle height of silicon strip 124. As shown in FIG. 10B, widths W1 and W2 are measured at height H1/2 above the top surfaces of SI regions 136. As also shown in FIG. 10B, the dashed sidewalls of the original semiconductor fin 144 are extended from the sidewalls of STI regions 136. Sidewalls 124A of the thinned silicon strips 124, however, are recessed toward the center line 160 of silicon strip 124. The top surface of silicon fin 124 is also lowered due to the thinning.

N-type epitaxy region 156 is epitaxially grown from the thinned silicon strip 124. In accordance with some embodiments, n-type epitaxy region 156 comprises SiP, wherein phosphorous may be in-situ doped when n-type epitaxy region 156 is grown. Other n-type impurity (such as arsenic) other than phosphorous can also be used. Since n-type epitaxy region 156 has a lattice constant smaller than the lattice constant of the underlying SiGe strips 122, a tensile strain is generated in the channel region of the respective n-type FinFET by source/drain regions 154. Advantageously, with the thinning of semiconductor strip 124 before the epitaxial growth process, the profile of the resulting n-type epitaxy region 156 is more like an ellipse than a diamond shape. In accordance with some exemplary embodiments, the concentration of phosphorus in the resulting source/drain region 154 is in the range between about $5E20/cm^3$ and about $2E21/cm^3$. Furthermore, silicon strip 124 may not be doped with phosphorus when it is formed in the steps illustrated in FIGS. 1 and 2. However, in the thermal processes following the step illustrated in FIGS. 10A and 10B, phosphorous diffuses into the thinned silicon strip 124. There may be, or may not be, a significant drop in phosphorus concentration at the interface between SiP region 156 and the thinned silicon strip 124. Also, a gradient in doping concentration may be generated, wherein outer portions of silicon strip 124 adjoining SiP region 156 have higher n-type impurity (phosphorous) concentrations than inner portions of silicon strips 124. The n-type doping concentration may gradually and continuously increase from the inner regions to the outer regions of the thinned silicon strip 124.

As also shown in FIG. 10B, in the formation of source/drain regions 254, semiconductor fin 244, which comprises SiGe strip 242 in some embodiments, is thinned first. The thinning may include a wet etch, and the etchant may include a solution comprising $NH_3OH$ and $H_2O_2$ in some embodiments. In alternative embodiments, the etchant includes HF, hydrogen peroxide ($H_2O_2$), and acetic acid ($CH_3COOH$), for example. Dashed lines 258 illustrate the positions of the edges and the top surface of SiGe strip 242 before the thinning. As a result of the thinning, the width W1' of the thinned semiconductor fin 244 is reduced from its original width W2' before the thinning. In accordance with some embodiments, width W1' is between about 50 percent and about 70 percent of width W2', although width W1' may be greater or smaller. Widths W1' and W2' may be measured from a mid-height of SiGe fin 242. As shown in FIG. 10B, the dashed sidewalls 258 of the original semiconductor fin 244 are extended from the sidewalls of STI regions 236. Sidewalls 242A of the thinned SiGe fin 242, however, are recessed toward the center line 260 of SiGe fin 242. The top surface of the thinned SiGe fin 242 is also lowered due to the thinning.

P-type epitaxy region 256 is epitaxially grown from the thinned SiGe fin 242. In accordance with some embodiments, p-type epitaxy region 256 comprises SiGeB, wherein boron may be in-situ doped when p-type epitaxy region 256 is grown. Other p-type impurity (such as indium) other than boron can also be used. Since p-type epitaxy region 256 has a lattice constant greater than the lattice constant of the underlying silicon strips 224 and/or SiGe strips 222, a compressive strain is generated in the channel region the respective p-type FinFET by source/drain regions 254. In accordance with some exemplary embodiments, the concentration of the p-type impurity (such as boron) in the resulting source/drain region 254 is in the range between about $5E20/cm^3$ and about $2E21/cm^3$. Furthermore, SiGe strip 242 may not be doped with p-type impurity (such as boron) when it is epitaxially grown. However, in the thermal processes following the step in FIGS. 10A and 10B, boron diffuses into the thinned SiGe strip 242. Also, a gradient in doping concentration may be formed, wherein outer portions of SiGe strip 242 adjoining SiGeB region 256 have higher p-type impurity concentrations than the inner portions. The p-type doping concentration may gradually increase from inner regions to the outer regions of the thinned silicon strip 242.

SiGeB region 256 may be a homogenous region having a high germanium percentage higher than the first germanium percentage of SiGe strip 242. The germanium percentage of SiGeB region 256 may be in the range between about 70 percent and about 100 percent (which means germanium without silicon). In accordance with alternative embodiments, SiGeB region 256 includes SiGeB region 256A having a second germanium percentage higher than the first germanium percentage of SiGe strip 242. The second germanium percentage may be in the range between about 60 percent and about 80 percent. Outside SiGeB region 256A is formed SiGeB region 256B, which has a third germanium percentage higher than the second germanium percentage of SiGeB region 256A. The third germanium percentage may be in the range between about 80 percent and about 100 percent in accordance with some embodiments. SiGeB region 256, 256A, and 256B may have gradient germanium percentages, with the outer portions having increasingly higher germanium percentage than the inner portions.

Figure 11:
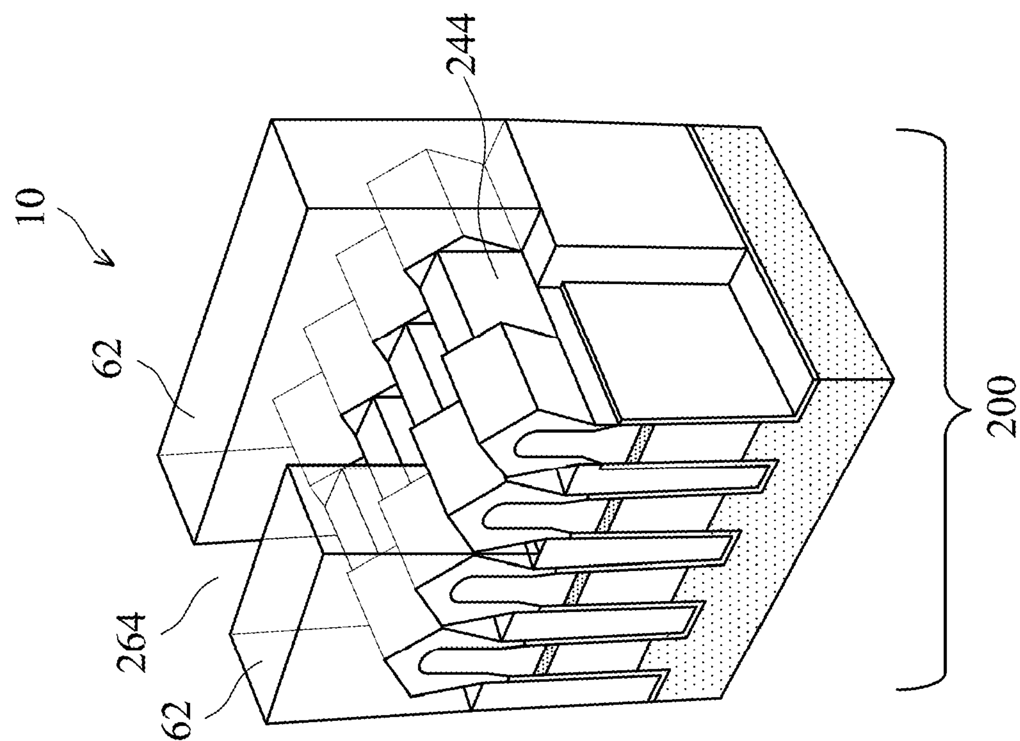
Figure 11:
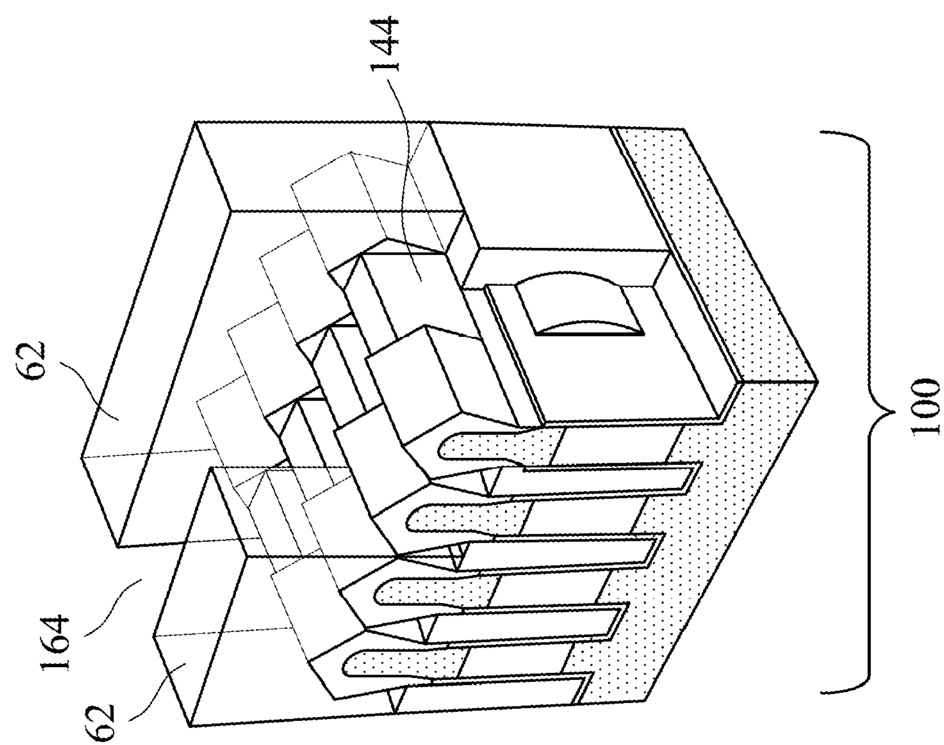

FIG. 11 illustrates a perspective view of the structure after Inter-Layer Dielectric (ILD) 62 is formed. ILD 62 comprises a dielectric material such as silicon oxide, Phospho-Silicate Glass (PSG), Boro-Silicate Glass (BSG), Boron-Doped Phospho-Silicate Glass (BPSG), or the like. A CMP may be performed to level the top surface of ILD 62 with the top surface of dummy gate stacks 146 and 246 (FIG. 10A). Next, dummy gate stacks 146 and 246 are removed in an etching step, so that recesses 164 and 264 are formed in ILD 62, as shown in FIG. 11. Recesses 164 and 264 are located in regions 100 and 200, respectively. The middle portions of semiconductor fins 144 and 244 are thus exposed to recesses 164 and 264, respectively.

Figure 12A:
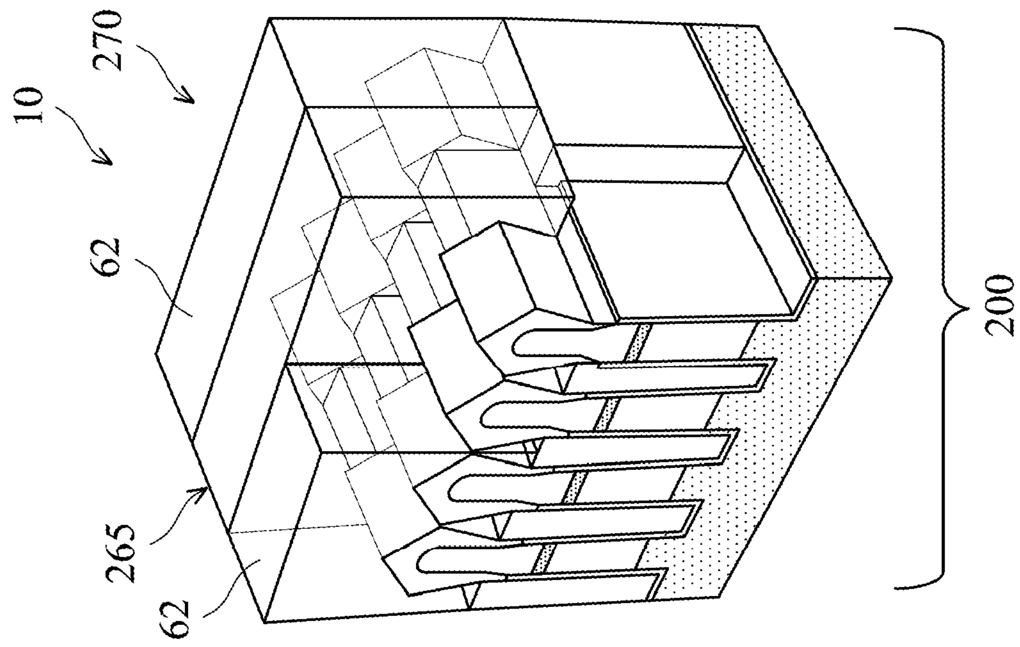
Figure 12A:
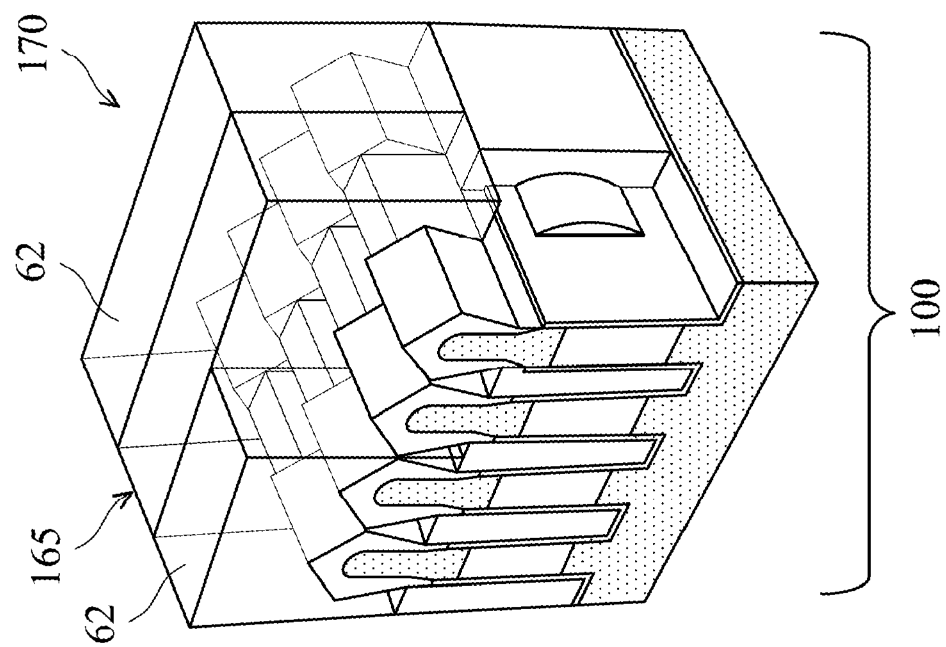
Figure 12B:
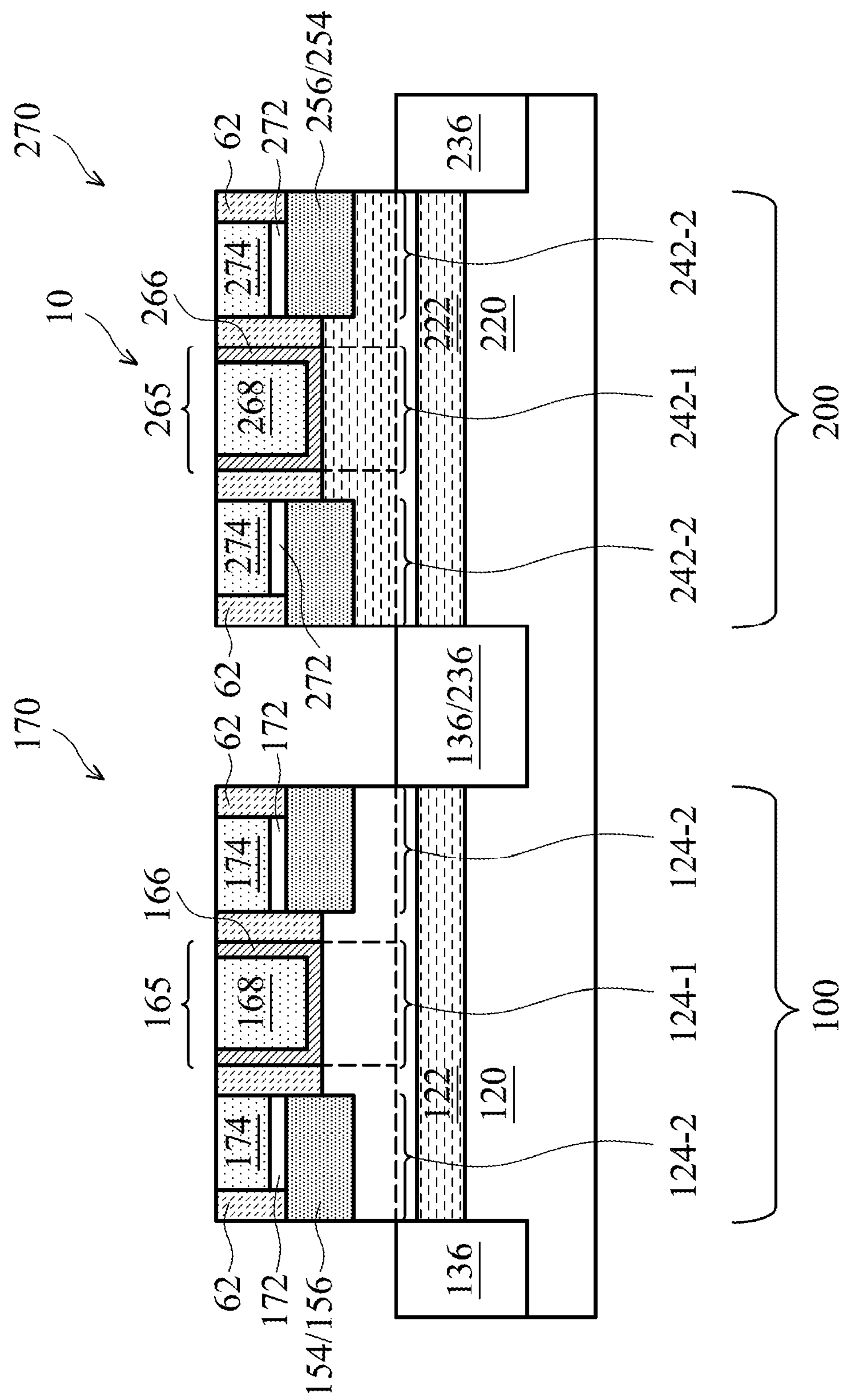

FIGS. 12A and 12B illustrate the formation of replacement gates 165 and 265, which include gate dielectrics 166 and 266 and gate electrodes 168 and 268. FinFETs 170 and 270 are thus formed. FIG. 12A illustrates a perspective view. FIG. 12B illustrates the cross-sectional views obtained from the planes perpendicular to the source-to-drain directions of FinFETs 170 and 270. As shown in FIG. 12B, silicon strip 124 includes portion 124-1 (which is a part of fin 144) overlapped by replacement gate stack 165, and thinned portion 124-2 acting as the inner portions of source/drain regions 154. Portions 124-1 and 124-2 have the same composition of group IV semiconductor elements such as silicon, for instance. Furthermore, the top surfaces of the thinned portions 124-2 are lower than the top surface of the un-thinned portion 124-1.

SiGe strip 242 includes portion 242-1 overlapped by replacement gate stack 265, and thinned portion 242-2 acting as the inner portions of source/drain regions 254. Portions 242-1 and 242-2 have the same composition of group IV semiconductor elements such as silicon and germanium for instance, with the germanium percentage and silicon percentage in portion 242-1 equal to the respective germanium percentage and silicon percentage in portions 242-2. Throughout the description, when two regions are referred to as having the same composition of group IV semiconductor elements, the two regions have the same percentages of silicon and the same percentage of germanium. Furthermore, the top surface of the thinned portions 242-2 is lower than the top surface of the un-thinned portion 242-1. Silicide regions 172 and 272 and source/drain contact plugs 174 and 274 are also illustrated in FIG. 12B.

Figure 12C:
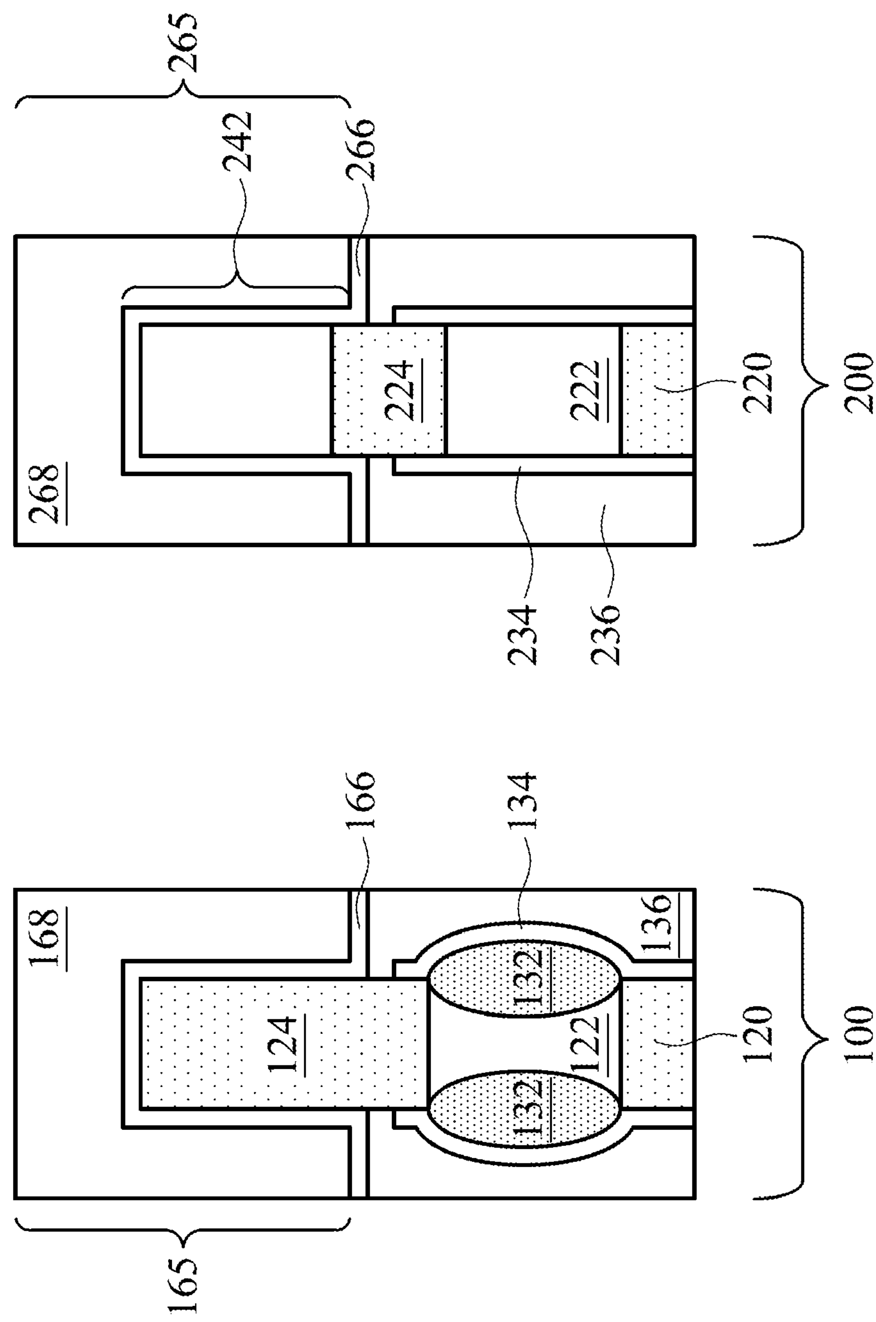

FIG. 12C illustrates the cross-sectional views of FinFETs 170 and 270, wherein the cross-sectional views are obtained crossing replacements gates 165 and 265 and in a direction perpendicular to the source-to-drain directions. As shown in FIG. 12C, $SiGeO_x$ regions 132 have some portions overlapped by silicon fin 124.

The embodiments of the present disclosure have some advantageous features. The formation of source/drain regions include thinning, but not totally removing, the original portions of semiconductor fin, and then epitaxially growing epitaxy regions on the thinned semiconductor fin. This has the advantageous features of maintaining the strain in channel regions. As a comparison, if the original portions of semiconductor fin are totally removed followed by the re-growth of source/drain regions, the strain may be relaxed. On the other hand, if the original semiconductor fins are not thinned before growing epitaxy regions, the respective n-type or p-type dopant of the source/drain regions cannot effectively diffuse throughout the source/drain regions.

In accordance with some embodiments of the present disclosure, a device includes a semiconductor substrate, and isolation regions extending into the semiconductor substrate. A semiconductor fin is between opposite portions of the isolation regions, wherein the semiconductor fin is over top surfaces of the isolation regions. A gate stack overlaps the semiconductor fin. A source/drain region is on a side of the gate stack and connected to the semiconductor fin. The source/drain region includes an inner portion thinner than the semiconductor fin, and an outer portion outside the inner portion. The semiconductor fin and the inner portion of the source/drain region have a same composition of group IV semiconductors.

In accordance with alternative embodiments of the present disclosure, a device includes a silicon substrate, isolation regions extending into the silicon substrate, and a p-type FinFET. The p-type FinFET includes a silicon germanium fin including a middle portion and end portions on opposite sides of the middle portion. A top surface of the middle portion is higher than top surfaces of the end portions. The silicon germanium fin has a first germanium percentage. The p-type FinFET further includes a gate stack overlapping the middle portion of the silicon germanium fin, and a source/drain region. The source/drain region includes one of the end portions of the silicon germanium fin as an inner portion, and a silicon germanium region outside of the inner portion. The silicon germanium region has a second germanium percentage higher than the first germanium percentage.

In accordance with yet alternative embodiments of the present disclosure, a method includes recessing isolation regions on opposite sides of a semiconductor strip to form a semiconductor fin, wherein the semiconductor fin is over top surfaces of the insulations, forming a gate stack on a top surface and sidewalls of a middle portion of the semiconductor fin, thinning an end portion of the semiconductor fin, and performing an epitaxy to grow a semiconductor region on the thinned end portion of the semiconductor fin. The thinned end portion of the semiconductor fin and the semiconductor region in combination form a source/drain region of a FinFET. Depending on the type of the FinFET, the semiconductor region comprises silicon phosphorous or silicon germanium boron.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a first semiconductor fin protruding above isolation regions, the first semiconductor fin having a first channel region, a first source region, and a first drain region, the first channel region being interposed between the first source region and the first drain region, wherein a width of the first channel region is greater than a width of the first source region and the first drain region, wherein each of the first channel region, the first source region and the first drain region protrude above the isolation regions;

forming oxidized regions along opposing sides of the first semiconductor fin, a width of the first semiconductor fin between the oxidized regions being less than a width of the first semiconductor fin above the oxidized regions and less than a width of the first semiconductor fin below the oxidized regions, wherein the isolation regions extend above the oxidized regions;

forming a second semiconductor fin protruding above isolation regions, the second semiconductor fin having a second channel region, a second source region, and a second drain region, the second channel region being interposed between the second source region and the second drain region, wherein a width of the second channel region is greater than a width of the second source region and the second drain region, wherein each of the second channel region, the second source region and the second drain region protrude above the isolation regions;

forming a first epitaxial region along sidewalls and an upper surface of an upper portion of the first source region and the first drain region of the first semiconductor fin;

forming a second epitaxial region along sidewalls and an upper surface of an upper portion of the second source region and the second drain region of the second semiconductor fin;

forming a first gate stack extending over the first channel region of the first semiconductor fin; and forming a second gate stack extending over the second channel region of the second semiconductor fin.

2. The method of claim 1, wherein forming the oxidized regions is performed prior to forming the first epitaxial region and forming the second epitaxial region.

3. The method of claim 1, wherein forming the first semiconductor fin comprises:

forming a first fin structure protruding above the isolation regions;

forming a first dummy gate stack over the first fin structure; and thinning the first fin structure on opposing sides of the first dummy gate stack, the thinning forming the first semiconductor fin.

4. The method of claim 3, wherein forming the oxidized regions comprises:

after forming the first fin structure and prior to forming the first dummy gate stack, forming a dielectric layer over the first fin structure;

patterning the dielectric layer to expose a channel region of the first fin structure; and oxidizing portions of the first fin structure on opposing sides of the first fin structure to form the oxidized regions.

5. The method of claim 4 further comprising forming the isolation regions after forming the oxidized regions.

6. The method of claim 4, wherein forming the first semiconductor fin comprises:

forming a first epitaxial layer;

forming a second epitaxial layer over the first epitaxial layer; and patterning the first epitaxial layer and the second epitaxial layer to form the first fin structure, wherein oxidizing comprises oxidizing portions of the first epitaxial layer.

7. The method of claim 6, wherein forming the second semiconductor fin comprises patterning the first epitaxial layer and the second epitaxial layer to form a second fin structure, and further comprising:

prior to oxidizing, forming a mask over the second fin structure; and after oxidizing, removing mask.

8. The method of claim 1, wherein the first epitaxial region and the second epitaxial region have different shapes.

9. A method of forming a semiconductor device, the method comprising:

forming a first semiconductor fin and a second semiconductor fin protruding from a substrate, wherein the first semiconductor fin comprises a first channel region interposed between a first region and a second region, the first semiconductor fin comprising a first semiconductor layer of a first semiconductor material and a second semiconductor layer of a second semiconductor material over the first semiconductor layer, wherein the second semiconductor fin comprises a second channel region interposed between a third region and a fourth region, the second semiconductor fin comprising a third semiconductor layer of the first semiconductor material, a fourth semiconductor layer of the second semiconductor material over the third semiconductor layer, and a fifth semiconductor layer over the fourth semiconductor layer, wherein a thickness of the second semiconductor layer is greater than a thickness of the fourth semiconductor layer;

forming oxidized regions along opposing sides of the first semiconductor layer below the first channel region, a width of the first semiconductor fin between the oxidized regions being less than a width of the first semiconductor fin above the oxidized regions and less than a width of the first semiconductor fin below the oxidized regions;

forming isolation regions along opposing sides of the first semiconductor fin and the second semiconductor fin, the first semiconductor fin and the second semiconductor fin extending above the isolation regions, wherein the isolation regions extend above the oxidized regions;

forming a first gate stack extending over the first channel region of the first semiconductor fin;

forming a second gate stack extending over the second channel region of the second semiconductor fin;

forming a first epitaxial region along sidewalls and an upper surface of an upper portion of the first region and the second region of the first semiconductor fin; and forming a second epitaxial region along sidewalls and an upper surface of an upper portion the third region and the fourth region of the second semiconductor fin.

10. The method of claim 9, wherein forming the second semiconductor fin comprises:

forming the third semiconductor layer of the first semiconductor material;

forming the fourth semiconductor layer of the second semiconductor material over the third semiconductor layer;

thinning the fourth semiconductor layer; and forming the fifth semiconductor layer over the thinned fourth semiconductor layer.

11. The method of claim 9, wherein forming the first gate stack comprises:

forming a dummy gate stack prior to forming the first epitaxial region and forming the second epitaxial region;

after forming the first epitaxial region and forming the second epitaxial region, forming a dielectric layer over the first epitaxial region and the second epitaxial region;

removing the dummy gate stack to form a recess; and forming the first gate stack in the recess.

12. The method of claim 11 further comprising:

after forming the dummy gate stack and prior to removing the dummy gate stack, thinning the second semiconductor layer of the first semiconductor fin and thinning the fifth semiconductor layer of the second semiconductor fin.

13. The method of claim 11, wherein the second semiconductor layer comprises silicon and thinning the second semiconductor layer comprises a wet etch using an etchant solution comprising HF, hydrogen peroxide ($H_2O_2$), and acetic acid ($CH_3COOH$).

14. The method of claim 13, wherein the fifth semiconductor layer comprises silicon germanium and thinning the second semiconductor layer comprises a wet etch using an etchant solution comprising $NH_3OH$ and $H_2O_2$.

15. The method of claim 14, wherein thinning the second semiconductor layer comprises thinning the second semiconductor layer to a width of between 50% and 70% of a width of the first semiconductor fin prior to thinning the second semiconductor layer.

16. The method of claim 14, wherein thinning the fifth semiconductor layer comprises thinning the fifth semiconductor layer to a width of between 50% and 70% of a width of the second semiconductor fin prior to thinning the fifth semiconductor layer.

17. A method of forming a semiconductor device, the method comprising:

forming a first semiconductor fin and a second semiconductor fin protruding from a substrate, wherein the first semiconductor fin comprises a first channel region, a first region, and a second region, the first channel region being interposed between the first region and the second region, wherein the second semiconductor fin comprises a second channel region, a third end region, and a fourth end region, the second channel region being interposed between the third end region and the fourth end region, wherein the first semiconductor fin and the second semiconductor fin comprise a first semiconductor layer of a first semiconductor material and a second semiconductor layer of a second semiconductor material on the first semiconductor layer, and wherein the second semiconductor fin further comprises a third semiconductor layer on the second semiconductor layer, the first semiconductor fin being free of the third semiconductor layer;

forming a first epitaxial region along sidewalls and an upper surface of the second semiconductor layer of the first semiconductor fin;

forming a second epitaxial region along sidewalls and an upper surface of the third semiconductor layer of the second semiconductor fin;

forming a first gate stack extending over the first channel region of the first semiconductor fin; and forming a second gate stack extending over the second channel region of the second semiconductor fin.

18. The method of claim 17 further comprising, prior to forming the first gate stack:

forming a mask over the second semiconductor fin and the first semiconductor fin, wherein the mask has an opening over the first channel region of the first semiconductor fin; and oxidizing opposing sidewalls of the first semiconductor layer in the first channel region of the first semiconductor fin to form oxidized regions, wherein a width of the first semiconductor fin between the oxidized regions being less than a width of the first semiconductor fin above the oxidized regions and less than a width of the first semiconductor fin below the oxidized regions.

19. The method of claim 18 further comprising, after oxidizing the opposing sidewalls:

forming isolation regions along opposing sides of the first semiconductor fin and the second semiconductor fin.

20. The method of claim 19, wherein the isolation regions extend above an upper surface of the oxidized regions of the second semiconductor layer of the first semiconductor fin.

* * * * *